(12) United States Patent
Wagner et al.

(10) Patent No.: US 6,913,201 B1
(45) Date of Patent: Jul. 5, 2005

(54) HOUSING FOR PORTABLE HANDHELD ELECTRONIC DEVICE

(75) Inventors: Gregg Wagner, Boulder, CO (US); Robert Stewart, Boulder, CO (US)

(73) Assignee: Allflex USA, Inc., Dallas, TX (US)

( * ) Notice: Subject to any disclaimer, the term of this patent is extended or adjusted under 35 U.S.C. 154(b) by 591 days.

(21) Appl. No.: 09/113,446

(22) Filed: Jul. 10, 1998

(51) Int. Cl.$^7$ .......................... G06K 7/10; A47B 81/00
(52) U.S. Cl. .................... 235/472; 312/223.2
(58) Field of Search ............................ 312/223.2, 263; 235/472.2, 472.01, 472.03, 472; 348/836, 348/837, 838, 839, 843; 220/783; 362/157, 362/158

(56) References Cited

U.S. PATENT DOCUMENTS

| | | | |
|---|---|---|---|
| 4,758,712 A | * | 7/1988 | Matone, Jr. et al. ..... 312/223.2 |
| 5,107,100 A | * | 4/1992 | Shepard et al. ........ 235/472.01 |
| 5,241,488 A | * | 8/1993 | Chadima et al. ............ 235/1 D |
| 5,368,380 A | * | 11/1994 | Mottmiller et al. ......... 312/263 |
| 5,566,504 A | * | 10/1996 | Pitel .............................. 49/28 |
| 5,796,091 A | * | 8/1998 | Schmidt et al. ........ 235/472.01 |
| 5,917,176 A | * | 6/1999 | Bottazzi ................ 235/472.01 |
| 6,073,852 A | * | 6/2000 | Seo ........................ 235/472.01 |

FOREIGN PATENT DOCUMENTS

JP 406139389 * 5/1994 ................. 235/472

* cited by examiner

Primary Examiner—Peter M. Cuomo
Assistant Examiner—Sarah C. Burnham
(74) Attorney, Agent, or Firm—Blakely Sokoloff Taylor & Zafman, LLP

(57) ABSTRACT

An injection-molded housing for a handheld portable electronic device employs a minimal number of parts. The housing, made of a thermoplastic elastomer, is watertight, buoyant and exceptionally rugged. Principal components of the housing snap together without the need for adhesive bonding or fasteners using a tongue-and-groove closure mechanism.

6 Claims, 1 Drawing Sheet

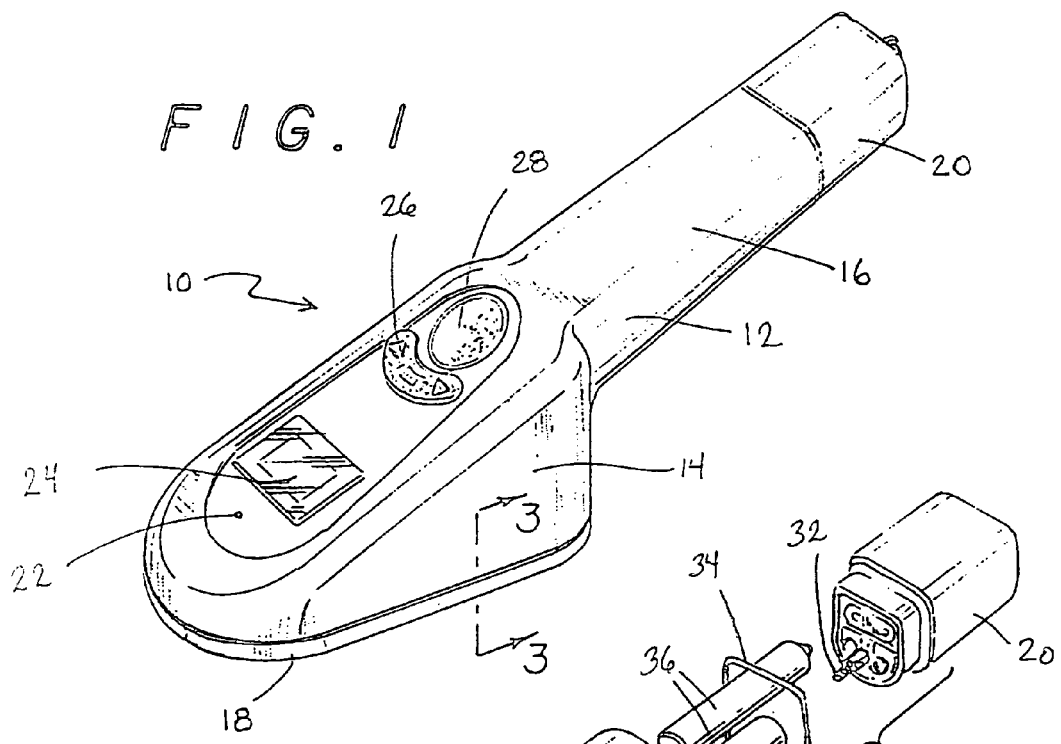
FIG. 1
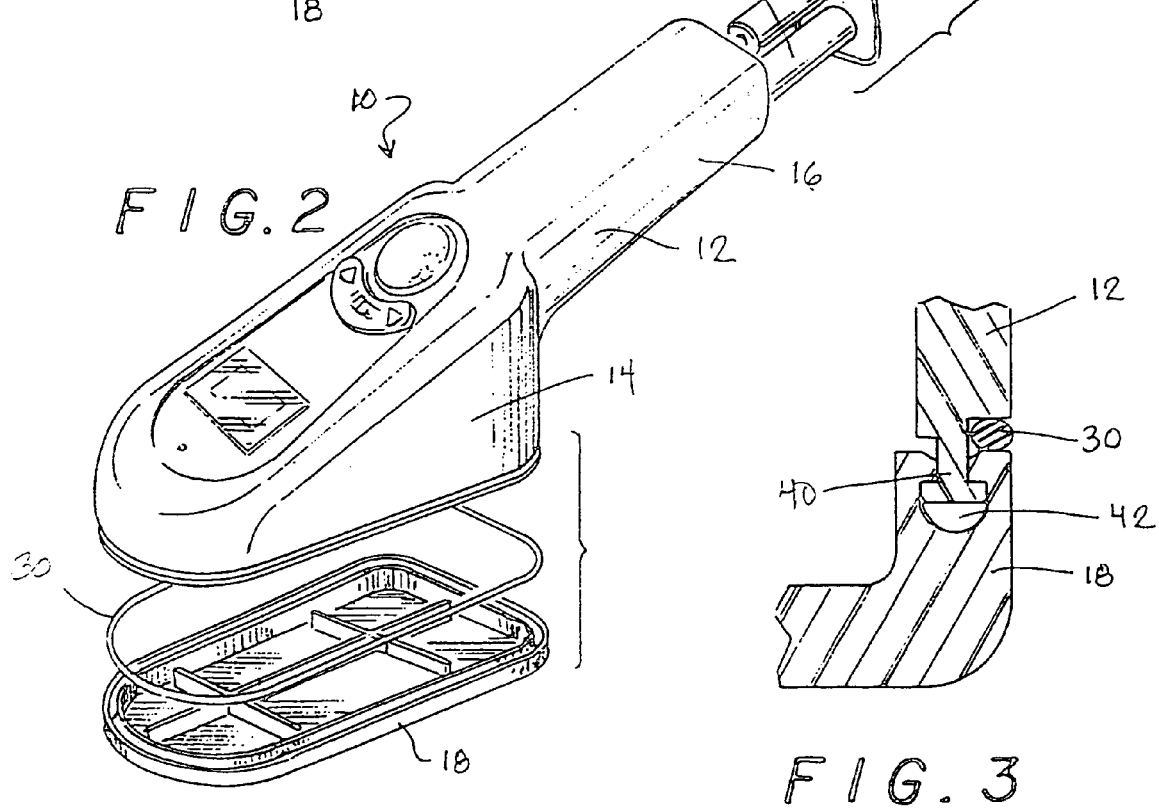
FIG. 2
FIG. 3

HOUSING FOR PORTABLE HANDHELD ELECTRONIC DEVICE

BACKGROUND OF THE INVENTION

1. Field of the Invention

The present invention relates generally to the field of housings for electronic devices. More particularly, the invention is a hermetically sealed housing for a portable handheld reader/scanner.

2. Prior Art

Animal identification systems increasingly use electronic tags. Such tags offer numerous advantages over conventional tags, particularly in the amount of data that can be stored and retrieved with a reader.

Readers for electronic animal identification tags are relatively complex electronic devices, particularly if designed to operate with a variety of identification protocols. To be useful in the field, a portable reader must withstand a wide range of environmental conditions, including moisture, dust, physical abuse, etc. The housing should therefore be hermetically sealed to protect the electronic components. A portable reader/scanner should also be lightweight and ergonomically designed.

SUMMARY OF THE INVENTION

The present invention provides a lightweight, ergonomic handheld portable device designed for ambidextrous use. An injection-molded housing employs a minimal number of parts and is hermetically sealed without the use of adhesives to join the component parts.

In an exemplary embodiment, the present invention provides a portable handheld scanner comprising a one-piece hollow body portion, a scan face and a handle end cap. The body portion and the scan face snap together without the need for adhesive bonding or fasteners using a tongue-and-groove closure mechanism.

BRIEF DESCRIPTION OF THE DRAWINGS

FIG. 1 is a perspective view of a portable handheld scanner housing constructed in accordance with the present invention.

FIG. 2 is an exploded view of the housing of FIG. 1.

FIG. 3 is a partial cross-sectional view taken through line 3—3 of FIG. 1.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

FIG. 1 illustrates an exemplary embodiment of the present invention. A portable handheld reader/scanner 10 has a hollow body portion 12 which consists of an electronics enclosure portion 14 and a barrel-grip handle portion 16. Body portion 12 is made as a single part rather than as two joined halves. This eliminates the need for bonding or otherwise joining two halves and also eliminates the presence of an unattractive seam line. The electronics enclosure portion 14 is closed off with scan face 18, and the handle portion is closed off with end cap 20. Controls and displays for the operation of reader/scanner 10 are provided on the top surface of enclosure portion 14. These include a light-emitting diode (LED) indicator 22, a liquid crystal display (LCD) alphanumeric display panel 24, menu and scroll buttons 26 and a power on/read button 28. Control buttons 26 and 28 are disposed for ease of operation by the thumb of a user, regardless of which hand reader/scanner 10 is held in.

Referring now to FIG. 2, the major components of reader/scanner 10 are shown in an exploded view. Scan face 18 snaps onto body portion 12 as will be more fully described below. A gasket 30 is applied around the perimeter of scan face 18 to aid in achieving a hermetic seal. End cap 20 attaches to the rear of body portion 12 with captive screw 32 which engages a threaded receptacle (not shown) in handle portion 16. Gasket 34 is applied to the interface between end cap 20 and handle portion 16 to achieve a hermetic seal. Handle portion 16 is conveniently used as a compartment for batteries 36.

Body portion 12, scan face 18 and end cap 20 are preferably made of a themoplastic elastomer such as Santoprene® manufactured by Advanced Elastomer Systems of Akron, Ohio. This produces a housing that is watertight, buoyant and exceptionally rugged. The surface of the housing has a non-slip gripping quality even when wet and will not crack or chip, even when dropped onto concrete from a height of two meters.

The final assembly of reader/scanner 10 is accomplished with ease and at low cost. An internal electronics printed circuit board (not shown) installs into slots integrally molded in enclosure portion 12. An antenna coil (also not shown) snaps into scan face 18 without fasteners. The body portion and scan face snap together and the end cap is attached with a single captive screw.

FIG. 3 illustrates details of the mechanism for attaching scan face 18 to body portion 12. A tongue-and-groove attachment mechanism is employed which takes advantage of the elastomeric properties of the Santoprene® material. Body portion 12 has a "T" shaped tongue 40 that mates with groove 42 in the perimeter of scan face 18. Owing to the resiliency of the material of which scan face 18 is made, tongue 40 snaps into groove 42 in a manner similar to the sealing mechanism widely used for plastic storage bags. A suitable seal can be achieved without the use of a separate gasket; however, gasket 30 may be applied around tongue element 40 to improve the hermeticity of the seal.

It will be recognized that the above described invention may be embodied in other specific 20 forms without departing from the spirit or essential characteristics of the disclosure. Thus, it is understood that the invention is not to be limited by the foregoing illustrative details, but rather is to be defined by the appended claims.

What is claimed is:

1. A housing for a portable handheld electronic reader/scanner comprising:

a seamless one-piece, hollow body portion made of a thermoplastic elastomer having an electronics enclosure portion and a handle portion, said electronics enclosure portion having an aperture entirely surrounded by a body perimeter portion;

a substantially planar scan face made of the thermoplastic elastomer adapted to cover said aperture, said scan face entirely surrounded by a scan face perimeter portion;

one of the body perimeter portion and scan face perimeter portion having a groove and the other having a projecting tongue element for mating engagement with the groove.

2. The housing of claim 1 further comprising an end cap coupled to the handle portion.

3. The housing of claim 1 wherein the handle portion comprises a battery compartment.

4. The housing of claim 1 further comprising a gasket disposed around the tongue element.

5. The housing of claim 2 further comprising a gasket disposed around the end cap.

6. The housing of claim 1 wherein the tongue portion has a substantially "T"-shaped cross section.

* * * * *